(12) United States Patent
Hao

(10) Patent No.: US 10,573,595 B2
(45) Date of Patent: Feb. 25, 2020

(54) ARRAY SUBSTRATE, FABRICATING METHOD THEREOF, AND DISPLAY DEVICE

(71) Applicants: BEIJING BOE OPTOELECTRONICS TECHNOLOGY CO., LTD., Beijing (CN); BOE Technology Group Co., Ltd., Beijing (CN)

(72) Inventor: Jingang Hao, Beijing (CN)

(73) Assignees: BEIJING BOE OPTOELECTRONICS TECHNOLOGY CO., LTD., Beijing (CN); BOE Technology Group Co., Ltd., Beiing (CN)

( * ) Notice: Subject to any disclaimer, the term of this patent is extended or adjusted under 35 U.S.C. 154(b) by 0 days.

(21) Appl. No.: 16/380,499

(22) Filed: Apr. 10, 2019

(65) Prior Publication Data

US 2019/0311904 A1 Oct. 10, 2019

Related U.S. Application Data

(62) Division of application No. 15/578,560, filed as application No. PCT/CN2017/086083 on May 26, 2017, now Pat. No. 10,304,682.

(30) Foreign Application Priority Data

Jul. 29, 2016 (CN) .......................... 2016 1 0619516

(51) Int. Cl.
*H01L 23/525* (2006.01)
*G02F 1/1362* (2006.01)
(Continued)

(52) U.S. Cl.
CPC .......... *H01L 23/525* (2013.01); *G02F 1/1368* (2013.01); *G02F 1/13439* (2013.01);
(Continued)

(58) Field of Classification Search
CPC ............. H01L 27/11206; H01L 23/525; H01L 23/5252; H01L 23/5254
See application file for complete search history.

(56) References Cited

U.S. PATENT DOCUMENTS 4,678,282 A 7/1987 Yaniv et al.
5,587,598 A * 12/1996 Hatanaka ................ H01L 23/62
257/355

(Continued)

FOREIGN PATENT DOCUMENTS

| CN | 103700657 A | 4/2014 |
|---|---|---|
| JP | 4304134 B2 | 7/2009 |
| KR | 20050039022 A | 4/2005 |

OTHER PUBLICATIONS

International Search Report & Written Opinion dated Sep. 6, 2017, regarding PCT/CN2017/086083.
First Office Action in the Chinese Patent Application No. 201610619516. 3, dated Jun. 4, 2018; English translation attached.
Notice of Allowance in the U.S. Appl. No. 15/578,560, dated Mar. 27, 2019.
Non-Final Office Action in the U.S. Appl. No. 15/578,560, dated Jan. 8, 2019.

(Continued)

*Primary Examiner* — Eduardo A Rodela
(74) *Attorney, Agent, or Firm* — Intellectual Valley Law, P.C.

(57) ABSTRACT

An array substrate, a fabricating method thereof, and a related display device are provided. The method for forming an array substrate can comprises: forming a plurality of signal lines over a base substrate; forming a conductive line over the base substrate, the conductive line connecting at least two of the plurality of signal lines; forming an insulating layer over the base substrate, the plurality of signal lines, and the conductive line; forming a via hole through the insulating layer at a position over the conductive line and between the at least two of the plurality of signal lines; and removing a portion of the conductive line through the via hole to disconnect the conductive line.

15 Claims, 13 Drawing Sheets

(51) Int. Cl.
*H01L 27/12* (2006.01)
*G02F 1/1368* (2006.01)
*G02F 1/1343* (2006.01)
*H01L 23/62* (2006.01)
*H01L 21/3213* (2006.01)
*H01L 21/28* (2006.01)
*H01L 21/311* (2006.01)
*H01L 21/673* (2006.01)
*H01L 27/02* (2006.01)
*H01L 27/112* (2006.01)

(52) U.S. Cl.
CPC .. *G02F 1/134363* (2013.01); *G02F 1/136204* (2013.01); *G02F 1/136286* (2013.01); *H01L 21/28* (2013.01); *H01L 21/311* (2013.01); *H01L 21/3213* (2013.01); *H01L 21/67396* (2013.01); *H01L 23/5252* (2013.01); *H01L 23/5254* (2013.01); *H01L 23/62* (2013.01); *H01L 27/0248* (2013.01); *H01L 27/0288* (2013.01); *H01L 27/11206* (2013.01); *H01L 27/12* (2013.01); *H01L 27/124* (2013.01); *H01L 27/1244* (2013.01); *G02F 1/136227* (2013.01); *G02F 2001/13629* (2013.01); *G02F 2001/13685* (2013.01); *G02F 2001/136295* (2013.01); *G02F 2201/121* (2013.01); *G02F 2201/123* (2013.01)

(56) References Cited

U.S. PATENT DOCUMENTS

| | | | |
|---|---|---|---|
| 5,926,156 A * | 7/1999 | Katoh | G09G 3/3677 345/55 |
| 6,713,837 B1 | 3/2004 | Mori et al. | |
| 2004/0109128 A1 | 6/2004 | Hirabayashi | |
| 2008/0073789 A1* | 3/2008 | Harris | H01L 23/525 257/758 |
| 2008/0205132 A1* | 8/2008 | Hirakata | B82Y 10/00 365/182 |
| 2008/0224229 A1 | 9/2008 | Tajima et al. | |
| 2010/0225870 A1 | 9/2010 | Park et al. | |
| 2014/0191331 A1 | 7/2014 | Price et al. | |
| 2014/0332780 A1* | 11/2014 | Hack | H01L 27/3281 257/40 |
| 2017/0221824 A1* | 8/2017 | Kimura | H01L 23/5258 |

OTHER PUBLICATIONS

Response to Non-Final Office Action in the U.S. Appl. No. 15/578,560, dated Mar. 3, 2019.
Restriction Requirement in the U.S. Appl. No. 15/578,560, dated Nov. 26, 2018.
Response to Restriction Requirement in the U.S. Appl. No. 15/578,560, dated Dec. 9, 2018.

* cited by examiner

ARRAY SUBSTRATE, FABRICATING METHOD THEREOF, AND DISPLAY DEVICE

CROSS-REFERENCES TO RELATED APPLICATIONS

This application is a divisional of U.S. application Ser. No. 15/578,560, filed May 26, 2017, which is a national stage application under 35 U.S.C. § 371 of International Application No. PCT/CN2017/086083, filed May 26, 2017, which claims priority to Chinese Patent Application No. 201610619516.3, filed on Jul. 29, 2016. Each of the forgoing applications is herein incorporated by reference in its entirety for all purposes.

TECHNICAL FIELD

The present disclosure relates to the field of liquid crystal panel manufacture and, more particularly, to an array substrate, a fabricating method thereof, and a related display device.

BACKGROUND

Electro-static discharge (ESD) has been a problem in manufacturing thin film transistor liquid crystal display (TFT-LCD) array substrates. ESD may cause a lower product yield, an increased cost, a decreased capacity, and can affect the quality of the liquid crystal display devices.

In the fabricating process of a liquid crystal panel, especially in some processes performed in a plasma environment, such as vacuum film formation and dry etching, static charge can be produced and accumulated on glass surfaces of the array substrate due to the voltage differences between adjacent signal lines. In the fabricating process of the array substrate, tools such as a mobile robot support column and/or a roller may be used to support the array substrate or to transfer the array substrate between different processes. A contact area between a tool, e.g., the mobile robot support column or the roller, and array substrate can be small. A large amount of electrostatic charge accumulated on the array substrate may form an electrostatic gathering point at the contact area between the array substrate and the tool, e.g., the mobile robot support column or the roller, which may cause an electrostatic breakdown and result in a damage to the array substrate.

BRIEF SUMMARY

In accordance with some embodiments of the present disclosure, an array substrate, a fabricating method thereof, and a related display device are provided.

One aspect of present disclosure provides a method for forming an array substrate, comprising: forming a plurality of signal lines over a base substrate; forming a conductive line over the base substrate, the conductive line connecting at least two of the plurality of signal lines; forming an insulating layer over the base substrate, the plurality of signal lines, and the conductive line; forming a via hole through the insulating layer at a position over the conductive line and between the at least two of the plurality of signal lines; and removing a portion of the conductive line through the via hole to disconnect the conductive line.

In some embodiments, the signal lines are first signal lines, the conductive line is a first conductive line, the insulating layer is a first insulating layer, and the via hole is a first via hole, the method further comprises: forming a plurality of second signal lines over the base substrate and the first insulating layer, projections of the plurality of second signal lines on the base substrate intersecting with projections of the plurality of first signal lines on the base substrate; forming a second conductive line over the base substrate, the second conductive line connecting at least two of the plurality of second signal lines; forming a second insulating layer over the base substrate, the plurality of second signal lines, and the second conductive line; forming a second via hole through the second insulating layer at a position over the second conductive line and between the at least two of the plurality of second signal lines; and removing a portion of the second conductive line through the second via hole to disconnect the second conductive line.

In some embodiments, the method further comprises: forming a source and a drain of a thin film transistor in a same patterning process that forms the plurality of signal lines.

In some embodiments, the method further comprises: forming a pixel electrode in a same patterning process that forms the conductive line.

In some embodiments, forming the plurality of signal lines and the conductive line includes forming the plurality of signal lines and the conductive line by a same patterning process.

In some embodiments, the method further comprises: forming a gate electrode of a thin film transistor in a same patterning process that forms the plurality of signal lines, the gate electrode being connected to one of the plurality of signal lines.

In some embodiments, the method further comprises: forming the plurality of signal lines, the conductive line, and the gate electrode includes forming the plurality of signal lines, the conductive line, and the gate electrode by the same patterning process.

In some embodiments, the via hole is a first via hole, the method further comprises, after forming the plurality of signal lines and before forming the conductive line: forming a gate insulating layer over the base substrate; and forming at least two second via holes through the gate insulating layer at positions over at least two of the plurality of signal lines.

In some embodiments, the method further comprises: forming a pixel electrode in a same patterning process that forms the conductive line, the conductive line filling in the at least two second via holes and connecting the at least two of the plurality of signal lines.

In some embodiments, the method further comprises: the signal lines are first signal lines, the method further comprises: forming, after forming the plurality of first signal lines and the conductive line and before forming the insulating layer, a plurality of second signal lines and a source and a drain of a thin film transistor over the base substrate by a same patterning process, wherein: projections of the plurality of second signal lines on the base substrate intersect with projections of the plurality of first signal lines on the base substrate, and the conductive line connects at least two of the plurality of second signal lines; forming a third via hole through the insulating layer at a position over the conductive line and between the at least two of the plurality of second signal lines in a same patterning process that forms the first via hole; and removing a portion of the conductive line through the first via hole and the third via hole to disconnect the conductive line.

In some embodiments, forming the insulating layer includes: forming, after the gate electrode is formed, a gate insulating layer over the base substrate, and forming a passivation layer over the base substrate, wherein the insulating layer includes the gate insulating layer and the passivation layer, and the via hole penetrates the passivation layer and the gate insulating layer.

In some embodiments, the method further comprises: forming a transparent conductive layer over the base substrate and the insulating layer, the transparent conductive layer filling the via hole and connects to the conductive line.

In some embodiments, the method further comprises: before removing the portion of the conductive line, performing a masking process and an exposing process on the transparent conductive layer.

In some embodiments, removing the portion of the conductive line includes: removing a portion of the transparent conductive layer in the via hole and the portion of the conductive line beneath the via hole to disconnect the conductive line, a common electrode being formed from the transparent conductive layer during the removing process.

In some embodiments, the method further comprises: forming the conductive line includes forming the conductive line connected to at least two of a plurality of leads in a non-display region of the array substrate.

Another aspect of the present disclosure provides an array substrate comprising a base substrate; a plurality of signal lines over the base substrate; a conductive line over the base substrate and connecting at least two of the plurality of signal lines; an insulating layer over the base substrate, the plurality of signal lines, and the conductive line; a via hole through the insulating layer at a position over the conductive line and between the at least two of the plurality of signal lines. The conductive line is disconnected at a location of the via hole.

In some embodiments, the signal lines are first signal lines, the conductive line is a first conductive line, the insulating layer is a first insulating layer, and the via hole is a first via hole. The array substrate further comprises a plurality of second signal lines over the base substrate and the first insulating layer. Projections of the plurality of second signal lines on the base substrate intersect with projections of the plurality of first signal lines on the base substrate. The array substrate also comprises a second conductive line over the base substrate and connecting at least two of the plurality of second signal lines; a second insulating layer over the base substrate, the plurality of second signal lines, and the second conductive line; a second via hole through the second insulating layer at a position over the second conductive line and between the at least two of the plurality of second signal lines. The second conductive line is disconnected at a location of the second via hole.

In some embodiments, the array substrate further comprises a transparent conductive layer over the base substrate and the insulating layer. The transparent conductive layer fills the via hole and connects to the conductive line.

In some embodiments, the array substrate further comprises a plurality of leads in a non-display region of the array substrate. The conductive line is connected to at least two of the plurality of leads.

Another aspect of the present disclosure provides a display device, comprising the disclosed array substrate.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify the same or like elements unless otherwise specified. That the following drawings are merely examples for illustrative purposes according to various disclosed embodiments and are not intended to limit the scope of the present disclosure.

Figure 1:
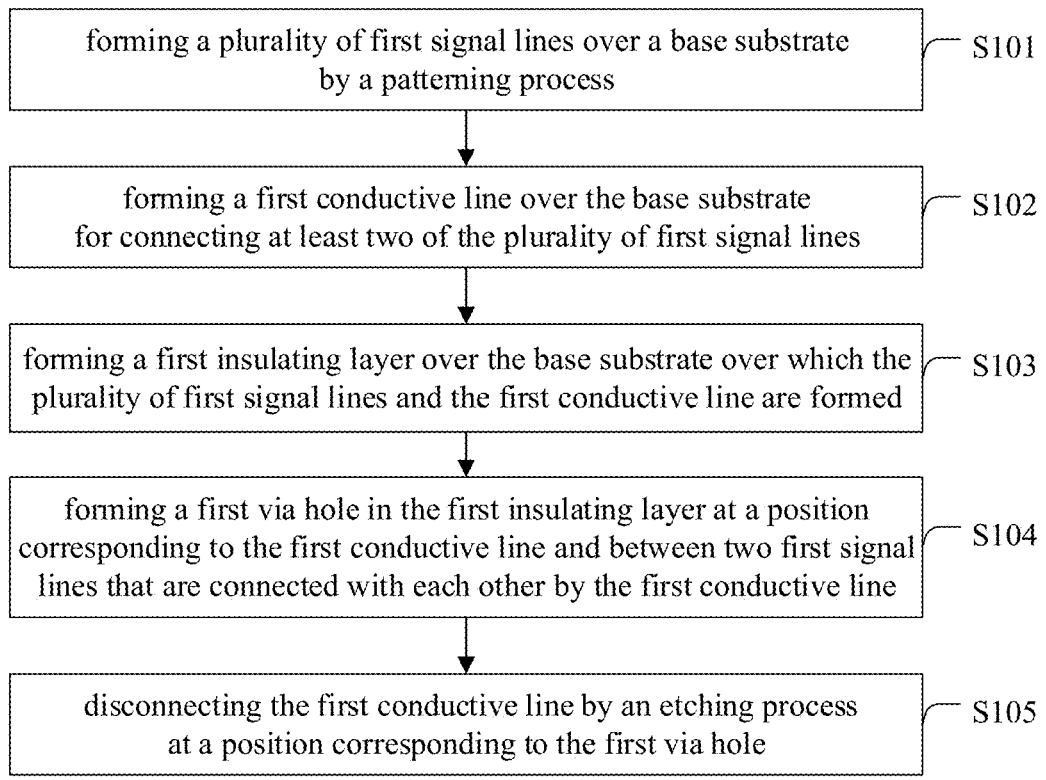
FIG. 1 illustrates a schematic flow diagram of an exemplary method for fabricating an array substrate in accordance with some embodiments of the present disclosure.

The reference numerals used in the figures may include the following:

10—base substrate;
11—first signal line;
12—first conductive line;
13—first insulating layer;
131—gate insulating layer;
132—passivation layer;

133—insulating film layer;
20—transparent conductive layer;
201—common electrode;
21—second signal line;
22—second conductive line;
23—second insulating layer;
30—source;
31, 31'—lead;
40—drain;
50—gate electrode;
60—pixel electrode;
a—first via hole;
b—second via hole;
c—third via hole;
d—fourth via hole;
X—display region; and
Y—non-display region.

DETAILED DESCRIPTION

Exemplary embodiments of the disclosure will be described in detail with reference to the accompanying drawings. The following description is made only by way of example, but does not limit the present disclosure. Various embodiments of the present disclosure and various features in the embodiments that do not conflict with each other can be combined and rearranged in various ways. Without departing from the spirit and scope of the present disclosure, modifications, equivalents, or improvements to the present disclosure are conceivable to those skilled in the art and are intended to be encompassed within the scope of the present disclosure.

In accordance with various embodiments, the present disclosure provides an array substrate, a fabricating method thereof, and a related display device.

Figure 2:
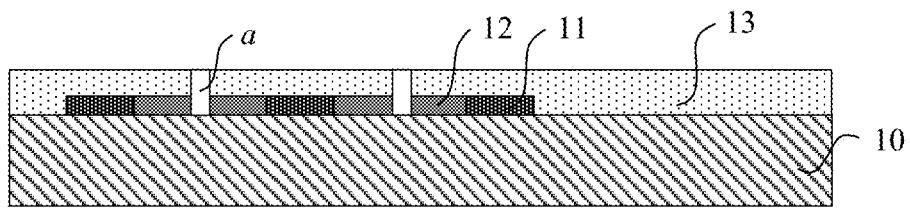
FIG. 2 illustrates a schematic structural diagram of an exemplary array substrate in accordance with some embodiments of the present disclosure.

FIG. 1 illustrate a schematic flow diagram of an exemplary method for fabricating an array substrate in accordance with some embodiments of the present disclosure. FIG. 2 is a cross-sectional view of the array substrate fabricated using the method shown in FIG. 1.

At S101, a plurality of first signal lines 11 are formed over a base substrate 10 by a patterning process, as shown in FIG. 2.

At S102, a first conductive line 12 is formed over the base substrate 10 for connecting at least two first signal lines 11. The voltage difference between the at least two first signal lines 11 connected by the first conductive line 12 can be eliminated, and thus the amount of static electricity can be reduced.

In some embodiments, all of the plurality of first signal lines 11 can be connected with each other by one first conduction line 12, such that the voltage differences among all of the plurality of first signal lines 11 can be eliminated by using the first conductive line 12.

At S103, a first insulating layer 13 is formed over the base substrate 10 over which the plurality of first signal lines 11 and the first conductive line 12 are formed.

At S104, a first via hole a is formed in the first insulating layer 13 at a position over the first conductive line 12 and between two first signal lines 11 that are connected with each other by the first conductive line 12.

At S105, the first conductive line 12 is disconnected by an etching process at a position corresponding to the via hole a. The etching process includes removing a portion of the first conductive line through the via hole a.

Figure 4:
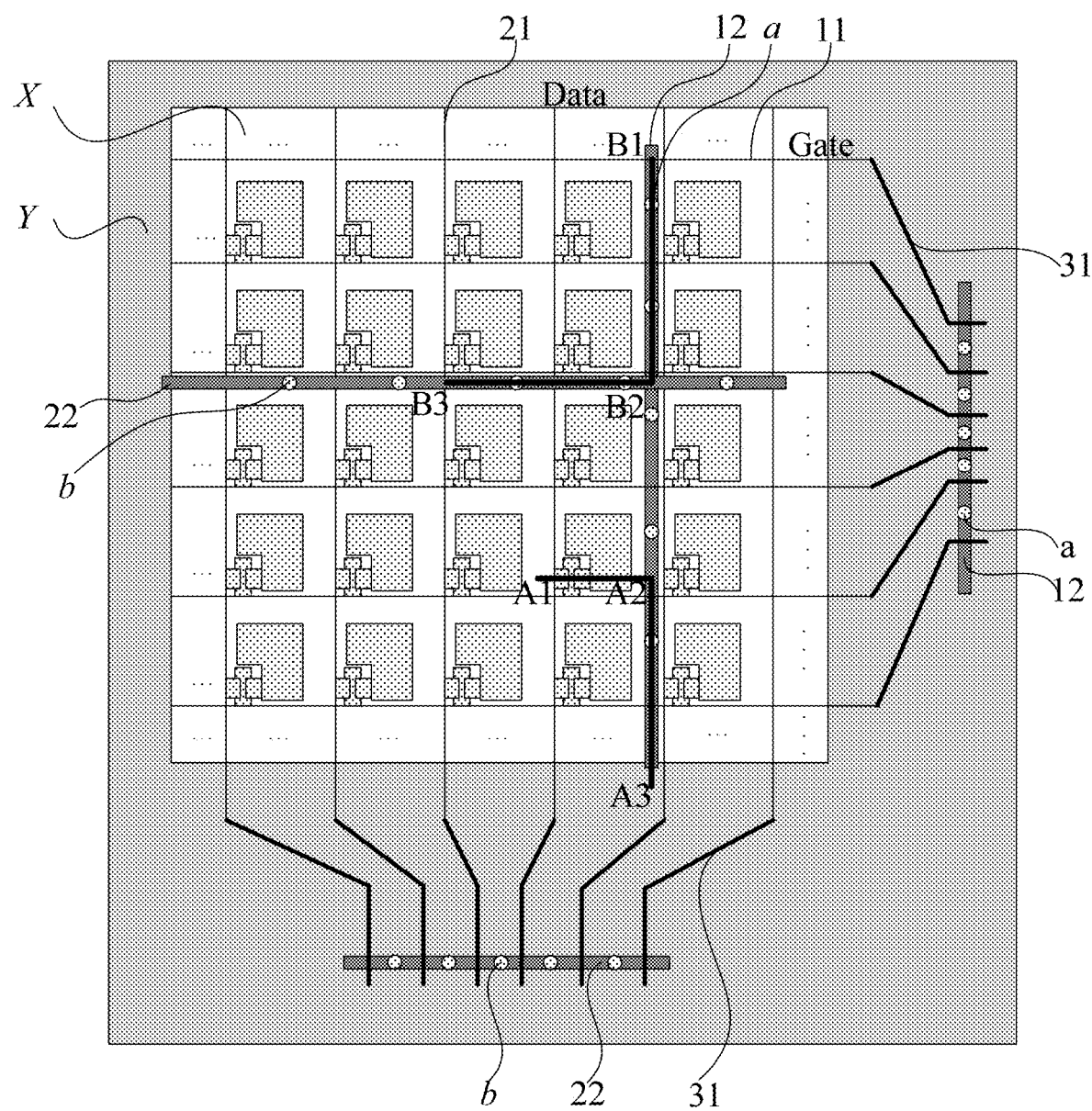
FIG. 4 illustrates a schematic top view of an exemplary array substrate in accordance with some embodiments of the present disclosure.

FIG. 4 is a schematic top view of an exemplary array substrate in accordance with some embodiments of the present disclosure. As illustrated, the array substrate can include a display region X and a non-display region Y. For the display region X, the first signal lines 11 may be gate lines and the first conduction line 12 connects at least two gate lines. The first conduction line 12 can be formed of a same material and in a same layer as the gate lines.

FIGS. 5-10 are schematic cross-sectional views of the array substrate shown in FIG. 4 along an A1-A2-A3 line at different stages of a fabricating process in accordance with some embodiments of the present disclosure.

Figure 5:
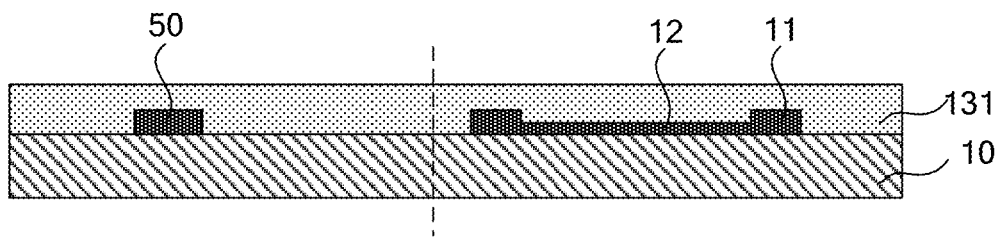
FIGS. 5-10 illustrate schematic cross-sectional views of the array substrate shown in FIG. 4 along an A1-A2-A3 line at certain stages of a fabricating process in accordance with some embodiments of the present disclosure.

As shown in FIG. 5, in a same patterning process for forming a gate electrode 50 and a plurality of gate lines, the first conductive line 12 is also formed to connect at least two gate lines with each other.

Then, a gate insulating layer 131 is formed over the base substrate 10 over which the plurality of gate lines are formed.

Figure 6:
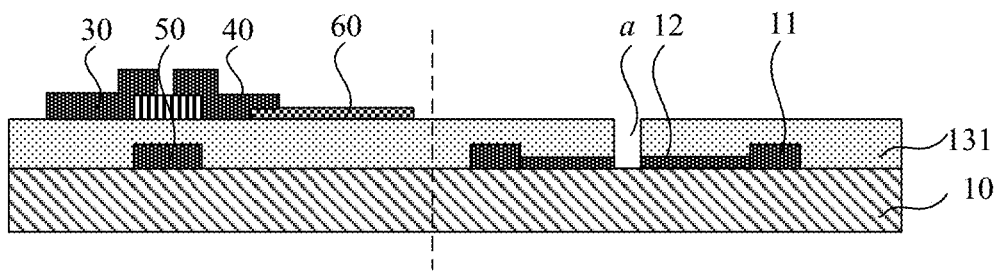

As shown in FIG. 6, an active layer, a pixel electrode 60, and a source 30 and a drain 40 of a thin film transistor (TFT) are formed by depositing and patterning corresponding material layers.

In some embodiments, the array substrate can be used in an advanced-super dimensional switching (ADS) display device. In such a device, a common electrode can be formed over the array substrate and a passivation layer can be formed between the common electrode and the pixel electrode 60, as described below.

Figure 7:
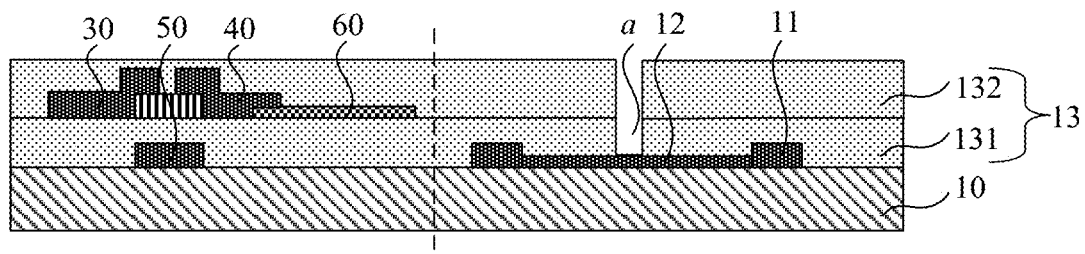

Specifically, as shown in FIG. 7, a passivation layer 132 is formed over the base substrate 10 over which the pixel electrode 60 is formed. The first via hole a penetrating the passivation layer 132 and the gate insulating layer 131 is formed in the passivation layer 132 and the gate insulating layer 131 at a position over the first conductive line 12. The first insulating layer 13 shown in FIG. 2 can include the passivation layer 132 and the gate insulating layer 131.

Figure 8:
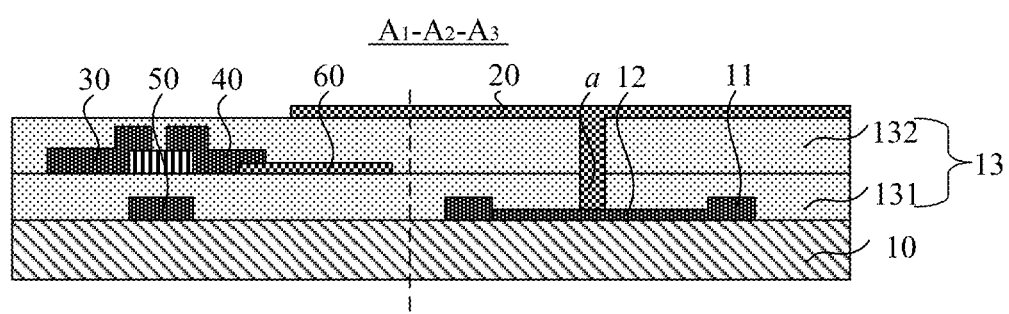

Further, as shown in FIG. 8, a transparent conductive layer 20 is formed over the base substrate 10 over which the passivation layer 132 is formed. The transparent conductive layer 20 fills the first via hole a and connects to the first conductive line 12.

Figure 9:
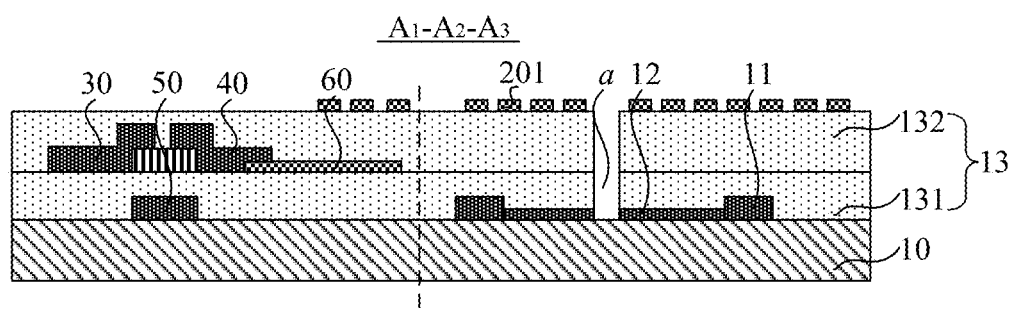

As shown in FIG. 9, the transparent conductive layer 20 is masked and exposed to form a common electrode 201. An etching solution capable of etching the metal material of the first conductive line 12 and the transparent conductive material of the transparent conductive layer 20 can be used in the process of forming the pattern of the common electrode 201. As such, the transparent conductive material of the common electrode 201 formed in the first via hole a and the metal material of the first conductive line 12 beneath the first via hole a can be removed. Thus, the first conductive line 12 can be disconnected, so that the two gate lines connected by the first conductive line 12 can be disconnected to properly function as gate lines.

In some embodiments, instead of or in addition to the metal material described above, the first conductive line 12 can include another conductive material, such as indium tin oxide (ITO) or indium zinc oxide (IZO).

The TFT in the array substrate may be a bottom gate type or a top gate type depending on the location relationship of the gate electrode, the gate insulating layers, and the base substrate. In a bottom gate type TFT, the gate electrode is located closer to the base substrate than the gate insulating layer. In a top gate type TFT, the gate electrode is located farther away from the base substrate than the gate insulating layer.

Figure 10:
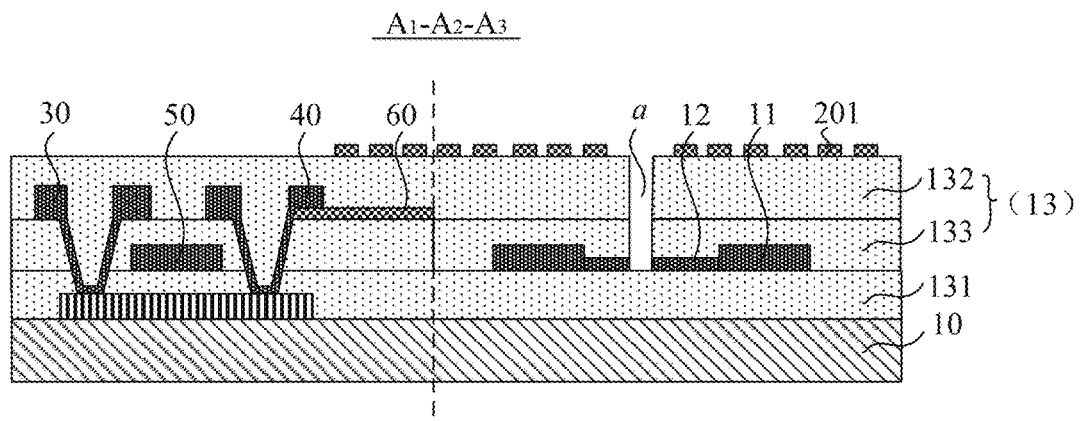

In the above embodiments, the array substrate having a bottom gate type TFT is described as an example. FIG. 10 is a cross-sectional view along the A1-A2-A3 line of another exemplary array substrate including a top gate type TFT. As shown in FIG. 10, the active layer and the gate insulating layer 131 are formed over the base substrate 10. Further, the gate electrode 50 of the TFT and the plurality of first signal lines 11, i.e., gate lines, can be formed by a patterning process. The same patterning process can also form the first conductive line 12 connecting at least two first signal lines 11, i.e., gate lines, to each other. The first conduction line 12 and the plurality of first signal lines 11, i.e., gate lines, can be formed of a same material and in a same layer.

An insulating film layer 133 can be formed by a patterning process over the base substrate 10 over which the gate lines are formed.

The pixel electrode 60, and the source 30 and the drain 40 of the TFT are formed over the base substrate 10 over which the insulating film layer 133 is formed. The source 30 and the drain 40 of the TFT can be respectively connected to the active layer through via holes.

The passivation layer 132 can be formed by a patterning process over the base substrate 10 over which the source 30 and the drain 40 of the TFT are formed. Further, the first through hole a penetrating the insulating film layer 133 and the passivation layer 132 is formed in the insulating film layer 133 and the passivation layer 132 at a position over the first conductive line 12. The first insulating layer 13 can include the insulating film layer 133 and the passivation layer 132.

Further, the transparent conductive layer 20 can be formed over the base substrate 10 over which the insulating film layer 132 and the passivation layer 132 are formed. The transparent conductive layer 20 can fill the first via hole a and connect to the first conductive line 12.

For the array substrate including a top gate type TFT, a process for etching and disconnecting the first conductive line 12 that connects at least two first signal lines 11, i.e., the gate lines, to each other can be similar to the etching and disconnecting process for the array substrate including a bottom gate type TFT, and thus detailed description is omitted here.

In some embodiments, the plurality of first signal lines 11 may be data lines. In these embodiments, the first conductive line 12 can be used for connecting at least two data lines to each other. In some embodiments, the first conductive line 12 and the plurality of first signal lines 11 may be formed of a same material and in a same layer. In some other embodiments, the first conductive line 12 can be made of the transparent conductive material described above.

Accordingly, by arranging the first conductive line 12 in the display region X, to connect a plurality of gate lines or a plurality of data lines with each other, the possibility of electrostatic charge generation in the display region X can be reduced.

For the non-display region Y, as shown in FIG. 4, the plurality of first signal lines 11 may be leads 31. The leads 31 and the gate lines or data lines may be made of a same material and in a same layer. The first conductive line 12 can be used for connecting at least two leads 31 to each other. A material of the first conductive line 12 can be the same as that in the embodiments described above. By providing the first conductive line 12 in the non-display region Y to connect the plurality of leads 31 with each other, the possibility of electrostatic charge generation in the non-display region Y can be reduced.

In some embodiments, the leads 31 and the data lines can be made of a same material and in a same layer, but the leads 31 and the gate lines can be in different layers. In these embodiments, an insulating layer can be arranged between the leads 31 and the gate lines. The leads 31 can be connected to the gate lines by a conductive material in via holes that are formed in and penetrate the insulating layer. As a result, the conduction performance between the leads 31 and the gate lines may be affected by the resistance of the conductive material. Thus, the conduction performance can be reduced.

On one hand, if the first conductive line 12 is provided only in the display region X, the electrostatic removal effect on the leads 31 in the non-display region Y may be undesirably affected by the resistance of the conductive material. On the other hand, if the first conductive line 12 is provided only in the non-display region Y, the electrostatic removal effect on the gate lines or the data lines in the display region X may be undesirable. Therefore, in some embodiments, first conduction lines 12 can be provided in the display region X and the non-display region Y, respectively, as shown in FIG. 4.

Further, the disclosed method for fabricating the array substrate does not limit the order of process S101 and process S102. A person skilled in the art may select to perform process S101 first or process S102 first as needed, or perform processes S101 and S102 concurrently.

According to the disclosed method for fabricating the array substrate, at least two first signal lines can be connected with each other through a first conduction line during the fabricating process. Thus, the voltage difference between the at least two first signal lines can be eliminated. Therefore, the generation and accumulation of static electricity on the array substrate due to the voltage differences between adjacent signal lines can be decreased, and the electrostatic breakdown at the array substrate having an electrostatic accumulation that may damage the array substrate can be avoided.

Further, after the first insulating layer is formed, a first via hole can be formed at a position over the first conductive line. In the etching process, e.g., the removing process, the first conducting line can be disconnected through the first via hole, so as to restore the function of the array substrate.

In some embodiments, the array substrate may include intersecting metal lines in different layers, such as gate lines and data lines. As illustrated in FIG. 4, the first signal lines 11 can be the gate lines and second signal lines 21 can be the data lines.

Figure 3:
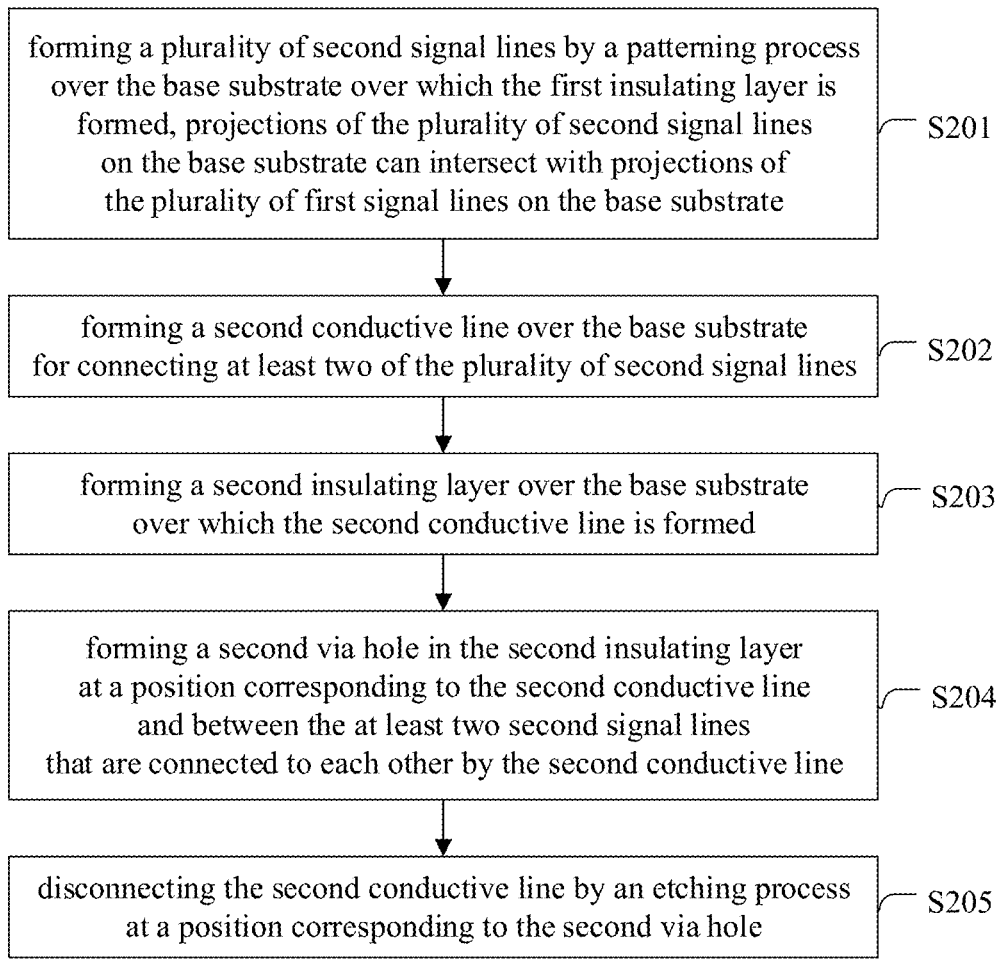
FIG. 3 illustrates a schematic flow diagram of another exemplary method for fabricating an array substrate in accordance with some other embodiments of the present disclosure.
Figure 11:
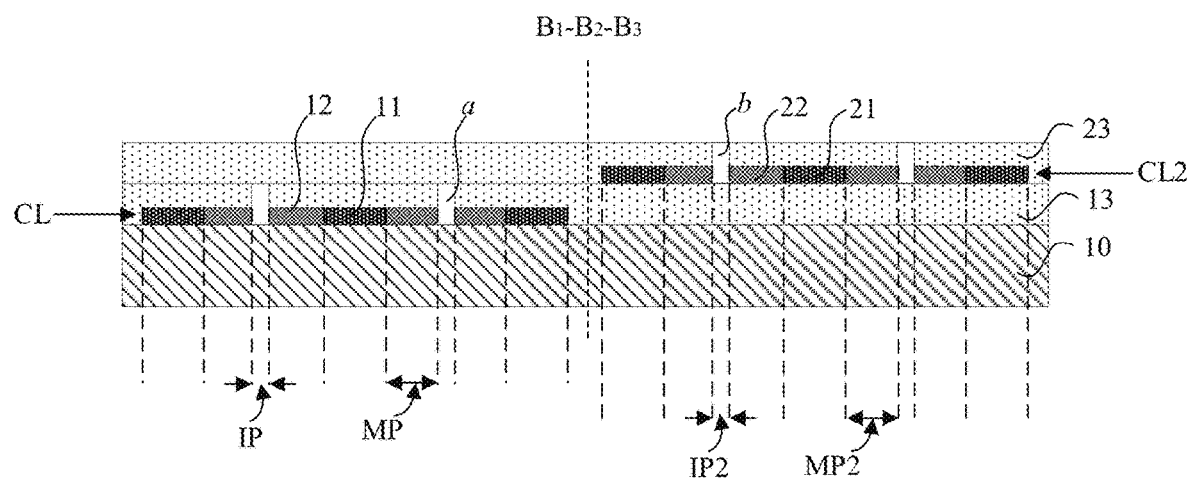
FIG. 11 illustrates a schematic cross-sectional view of the array substrate shown in FIG. 4 along a B1-B2-B3 line at a certain stage of the fabricating process in accordance with some embodiments of the present disclosure.

FIG. 3 is a flow chart showing another exemplary method for fabricating an array substrate consistent with the disclosure, and FIG. 11 is a cross-sectional view of the array substrate along a B1-B2-B3 line in FIG. 4 formed using the method shown in FIG. 3.

At S201, a plurality of second signal lines 21, i.e., data lines, are formed by a patterning process over the base substrate 10 over which the first insulating layer 13 is formed. As shown in FIG. 4, the projections of the second signal lines 21, i.e., the data lines, on the base substrate 10 can intersect with the projections of the first signal lines 11, i.e., the gate lines, on the base substrate 10.

At S202, a second conductive line 22 is formed over the base substrate 10 for connecting at least two second signal lines 21. The second conductive line 22 can cross over the first conductive line 12 as shown in FIGS. 4 and 11.

At S203, a second insulating layer 23 is formed over the base substrate 10 over which the second conductive line 22 is formed.

At S204, a second via hole b is formed in the second insulating layer 23 at a position over the second conductive line 22 and between the at least two second signal lines 21 that are connected to each other by the second conductive line 22.

At S205, the second conductive line 22 is disconnected by an etching process at a position corresponding to the second via hole b. The etching process includes removing a portion of the second conductive line 22 through the second via hole b.

In some embodiments, such as the embodiments described above, the first conductive line 12 and the plurality of gate lines (first signal lines 11) may be made of a same material and in a same layer. In some other embodiments, the first conductive line 12 can be made of the transparent conductive material described above. In some embodiments, the second conductive line 22 and the plurality of data lines (second signal lines 12) may be made of a same material and in a same layer. In some other embodiments, the second conductive line 22 can be made of the transparent conductive material described above.

Referring to FIG. 11, the array substrate in some embodiments includes a connecting line CL connecting the plurality of signal lines (e.g., the first signal lines 11). The connecting line CL includes a plurality of metal oxide portions MP and a plurality of insulating portions IP alternately arranged co-linearly and co-planarly. A respective one of the plurality of metal oxide portions MP is directly connected to one of two neighboring signal lines of the plurality of signal lines (e.g., one of two neighboring signal lines of the first signal lines 11). The respective one of the plurality of metal oxide portions MP is connected to another of the two neighboring signal lines (e.g., another of two neighboring signal lines of the first signal lines 11) through a respective one of the plurality of insulating portions IP. The respective one of the plurality of insulating portions IP insulates the two neighboring signal lines from each other. The plurality of metal oxide portions MP include a metal oxide material (e.g., indium tin oxide). The plurality of insulating portions include an insulating material.

Referring to FIG. 11 again, the array substrate in some embodiments further includes a second connecting line CL2 connecting the plurality of second signal lines (e.g., the second signal lines 21). The second connecting line CL2 includes a plurality of second metal oxide portions MP2 and a plurality of second insulating portion IP2 alternately arranged co-linearly and co-planarly. A respective one of the plurality of second metal oxide portions MP2 is directly connected to one of two neighboring second signal lines of the plurality of second signal lines (e.g., one of two neighboring signal lines of the second signal lines 21). The respective one of the plurality of second metal oxide portions MP2 is connected to another of the two neighboring second signal lines (e.g., another of two neighboring signal lines of the second signal lines 21) through a respective one of the plurality of second insulating portions IP2. The respective one of the plurality of second insulating portions IP2 insulates the two neighboring second signal lines from each other. The plurality of second metal oxide portions MP2 includes a metal oxide material (e.g., indium tin oxide). The plurality of second insulating portion IP2 include an insulating material.

In some other embodiments, the first conductive line 12 or the second conductive line 22 can be in a same layer as the pixel electrode 60 shown in FIG. 9. The first conductive line 12 or the second conductive line 22 can be connected to the plurality of first signal lines 11 or the plurality of second signal lines directly or through via holes.

FIGS. 13-17 are schematic cross-sectional views of the array substrate shown in FIG. 4 along the A1-A2-A3 line at different stages of a fabricating process in accordance with some other embodiments of the present disclosure. In the example shown in FIGS. 13-17, the first conductive line 12 and the pixel electrode 60 are formed of a same material and in a same layer.

As illustrated in FIG. 4, the plurality of first signal lines 11 and the first conductive line 12 are provided in the array substrate. The plurality of first signal lines 11 are gate lines.

Figure 13:
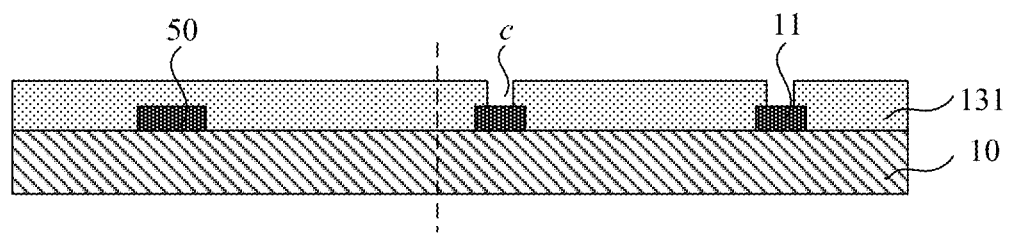
FIGS. 13-17 illustrate schematic cross-sectional views of the array substrate shown in FIG. 4 along the A1-A2-A3 line at certain stages of a fabricating process in accordance with some other embodiments of the present disclosure.

As shown in FIG. 13, the plurality of first signal lines 11 (gate lines) and the gate electrode 50 of the TFT are formed in a same process. The gate insulating layer 131 is formed over the base substrate 10 over which the plurality of first signal lines 11 (gate lines) are formed. Using a patterning process, at least two third via holes c are formed in the gate insulating layer 131 at positions over at least two first signal lines 11 (gate lines).

Figure 14:
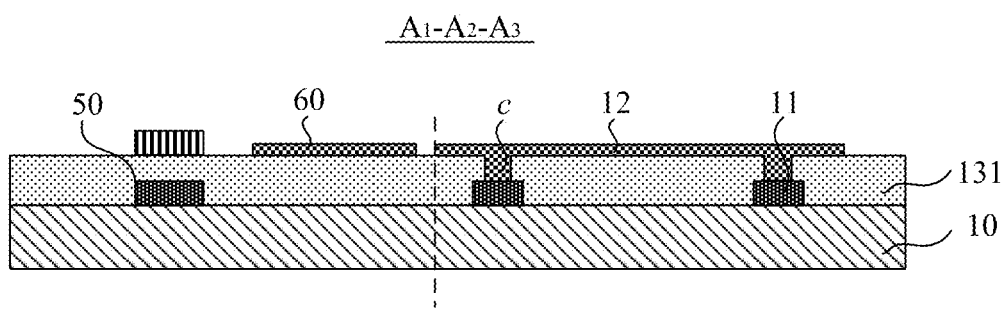

As shown in FIG. 14, the first conductive line 12 and the pixel electrode 60 are formed in a same patterning process. The first conductive line 12 and the pixel electrode 60 can be made of a same material and in a same layer. The first conductive line 12 is connected to the at least two first signal lines 11 (gate lines) through the at least two third via holes c.

Figure 15:
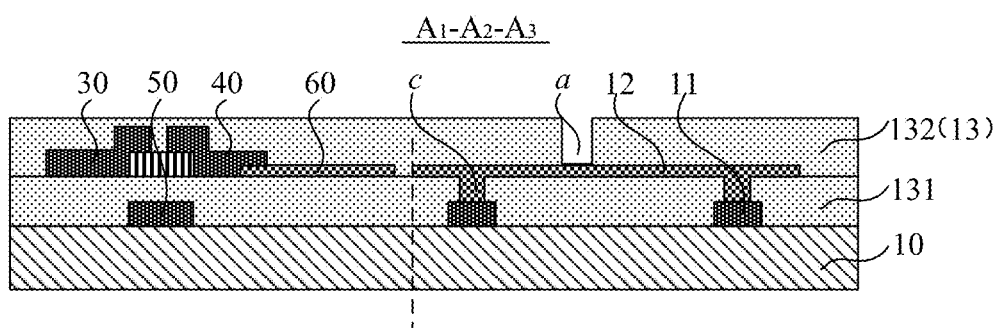

As shown in FIG. 15, the source 30 and the drain 40 of the TFT are formed by a patterning process over the base substrate 10 over which the pixel electrode 60 is formed.

In some embodiments, for an advanced-super dimensional switching (ADS) display device, the array substrate can further include the common electrode 201 insulated from the pixel electrode 60. Specifically, as shown in FIG. 15, the passivation layer 132 is formed by a patterning process over the base substrate 10 over which the source 30 and the drain 40 of the TFT are formed. The first via hole a is formed in the passivation layer 132 at a position over the first conductive line 12. The first insulating layer 13 includes the passivation layer 132.

Figure 16:
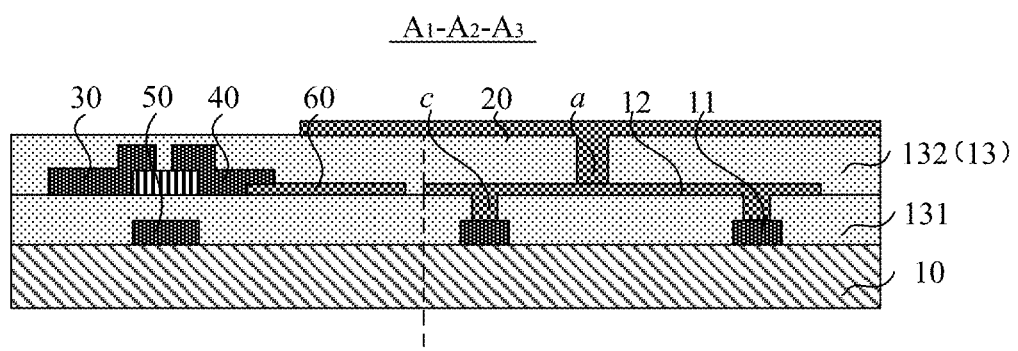

As shown in FIG. 16, the transparent conductive layer 20 is formed over the base substrate 10 over which the passivation layer 132 is formed. The transparent conductive layer 20 fills the first via hole a and connects to the first conductive line 12.

Figure 17:
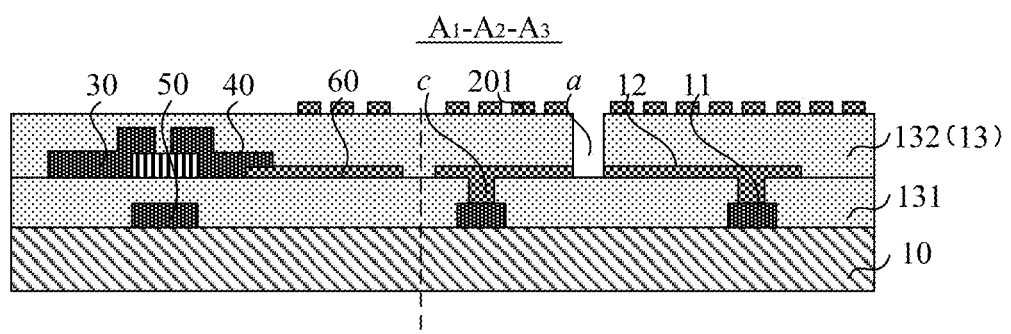

As shown in FIG. 17, the transparent conductive layer 20 is masked and exposed to form a pattern of the common electrode 201.

As such, the first conductive line 12 can be disconnected at the same time that the pattern of the common electrode 201 is formed. Thus, additional process step to disconnect the first conductive line 12 is not needed.

In some embodiments, a pattern corresponding to the first via hole a can be formed at a position over the first via hole a on a mask for the transparent conductive layer 20. After the transparent conductive layer 20 is masked and exposed, the transparent conductive layer 20 in the first via hole a can be removed while the pattern of the common electrode 201 is formed by an etching process.

Since the first conductive line 12, the pixel electrode 60, and the common electrode 201 are formed of a same transparent conductive material, one etchant can be used to etch the transparent conductive material in the first via hole a that forms the common electrode 201, and also disconnect the first conductive line 12 at the position corresponding to the first via hole a. That is, the at least two gate lines that are connected through the first conductive line 12 can be disconnected to restore the function of the gate lines.

In the embodiments described above, the first signal lines 11 are gate lines, and the first conductive line 12 and the pixel electrode 60 are formed of a same material and in a same layer. In some embodiments, the source 30 and the drain 40 of the TFT can be formed by a patterning process after the pixel electrode 60 and the first conductive line 12 are formed, as shown in FIG. 15. In some other embodiments, the source 30 and the drain 40 of the TFT can be formed by a patterning process before the pixel electrode 60 and the first conductive line 12 are formed. Other settings and etching processes can be the same as those in the exemplary embodiments described above, and are not repeated here.

Figure 18:
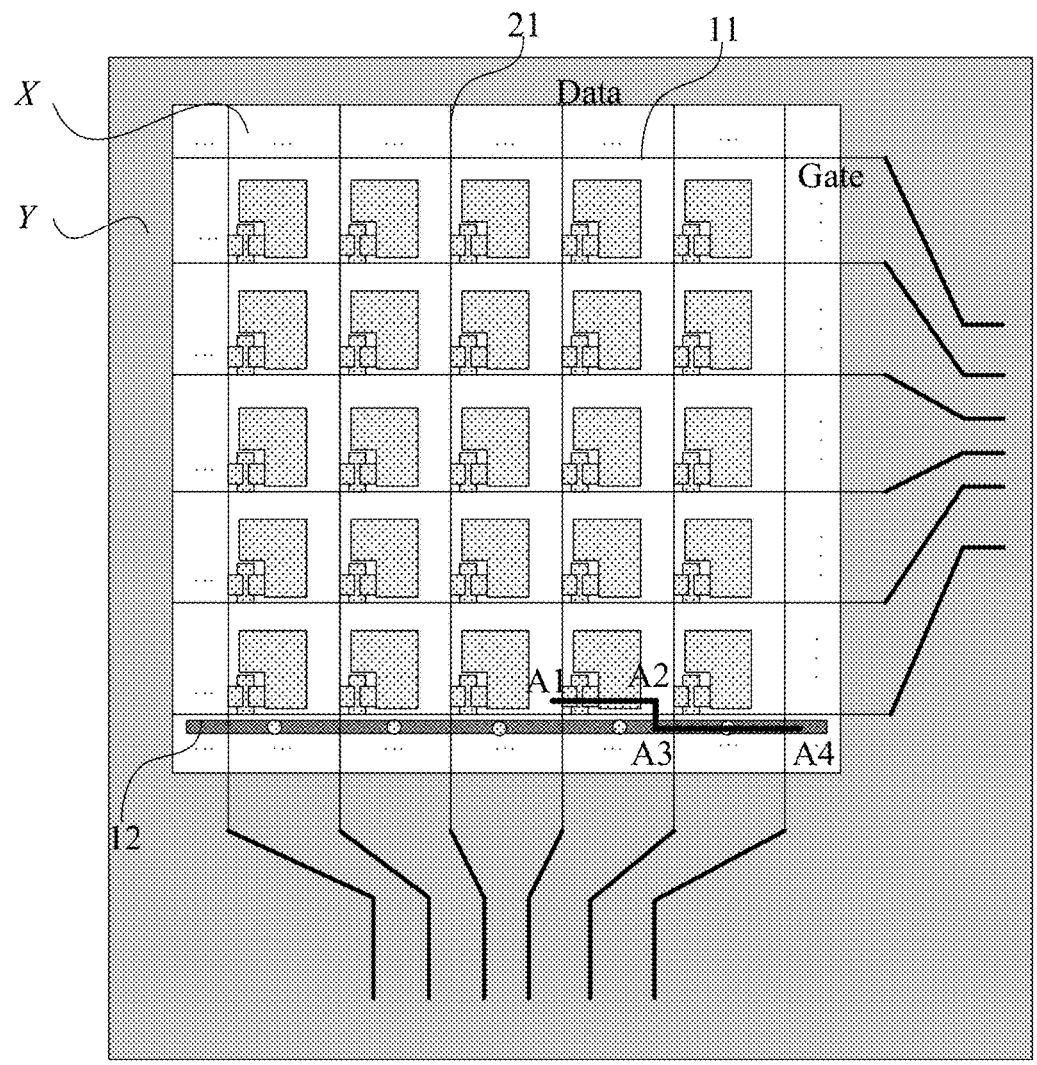
FIG. 18 illustrates a schematic top view of another exemplary array substrate in accordance with some other embodiments of the present disclosure.
Figure 19:
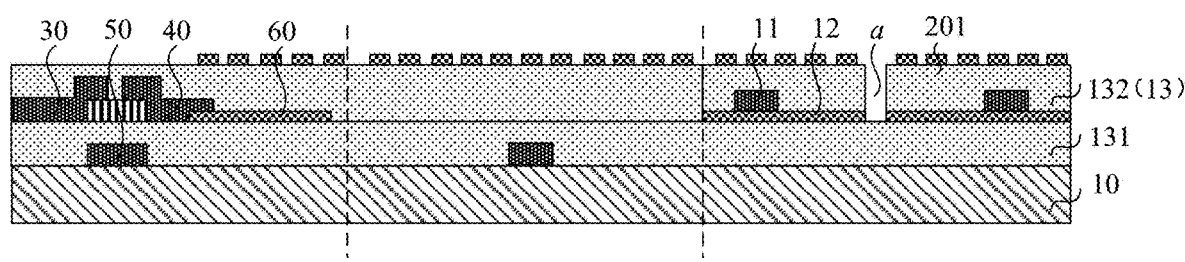
FIG. 19 illustrates a schematic cross-sectional view of the array substrate shown in FIG. 18 along an A1-A2-A3-A4 line in accordance with some embodiments of the present disclosure.

FIG. 18 is a schematic top view of another exemplary array substrate in accordance with some other embodiments of the present disclosure. FIG. 19 illustrates a schematic cross-sectional view of the array substrate shown in FIG. 18 along an A1-A2-A3-A4 line.

In some embodiments, as shown in FIG. 18, the array substrate can include the plurality of first signal lines 11 and the first conduction line 12. The plurality of first signal lines 11 are data lines. As shown in FIG. 19, the first signal lines 11 (data lines), and the source 30 and the drain 40 of the TFT can be formed at a same time.

In some embodiments, as shown in FIG. 19, the first conductive line 12 and the pixel electrode 60 are formed over the base substrate 10 by a same patterning process. The first conductive line 12 and the pixel electrode 60 can be made of a same material and in a same layer.

The source 30 and the drain 40 of the TFT are formed while the first signal lines 11 are formed over the base substrate 10 over which the pixel electrode 60 is formed. The first conductive line 12 connects at least two first signal lines 11.

Further, the passivation layer 132, i.e., the first insulating layer 13, the first via hole a, and the transparent conductive layer 20 are formed over the base substrate 10 over which the source 30 and the drain 40 of TFT are formed. The first conductive line 12 can be disconnected during a process for forming the common electrode 201. The detailed processes are similar to those in the embodiments described above, and are not repeated here.

Figure 20:
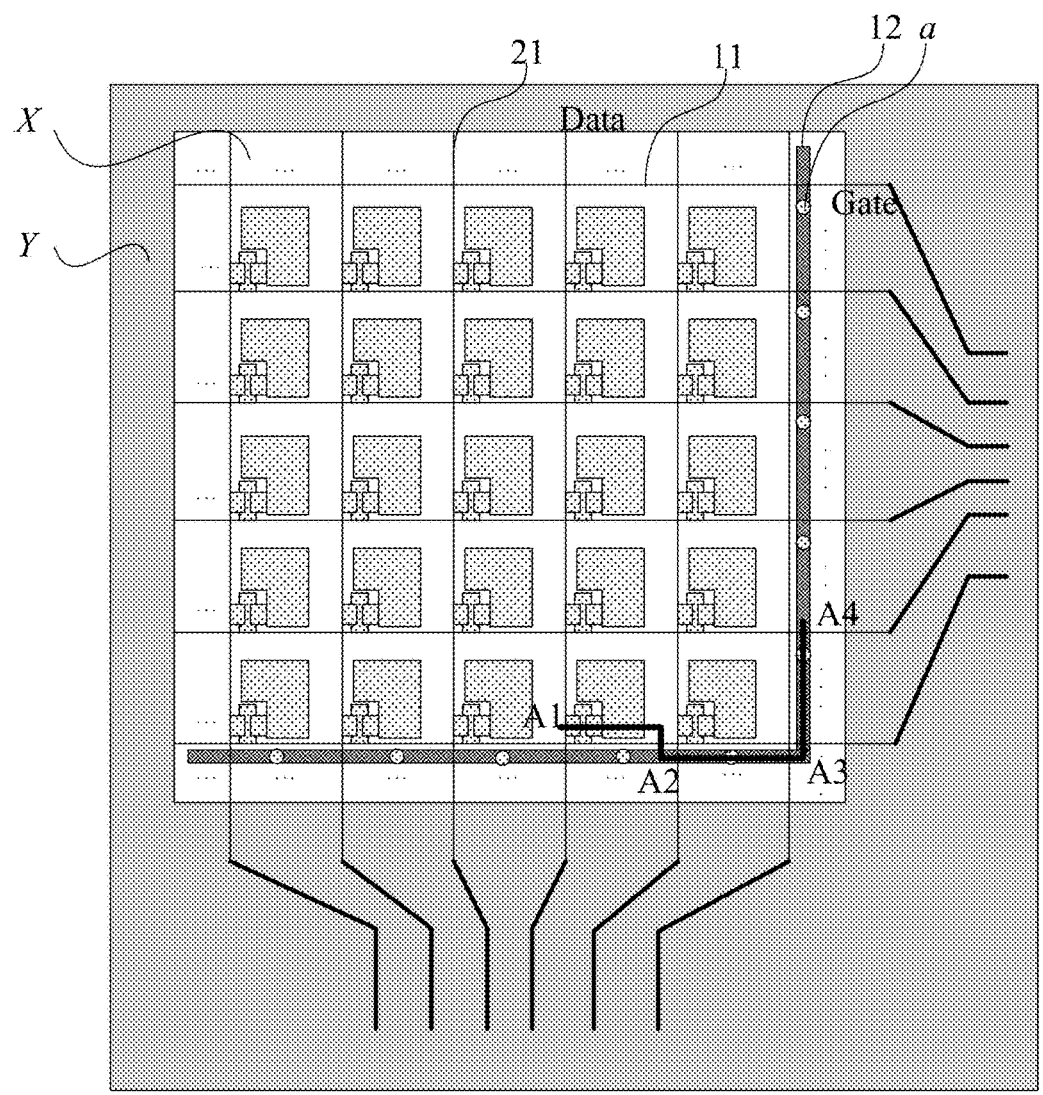
FIG. 20 illustrates a schematic top view of another exemplary array substrate in accordance with some other embodiments of the present disclosure.
Figure 21:
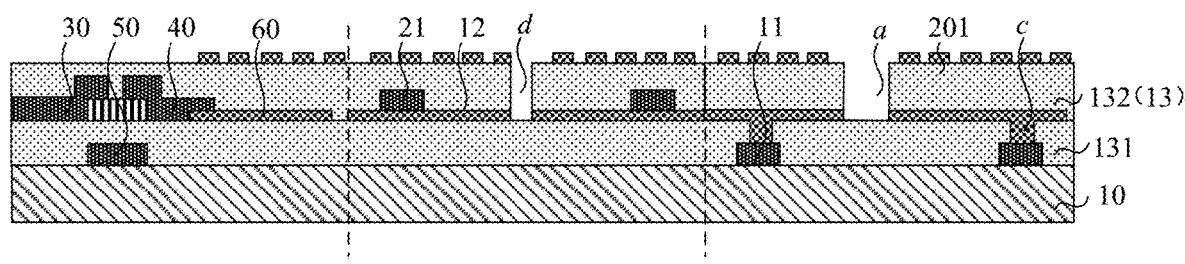
FIG. 21 illustrates a schematic cross-sectional view of the array substrate shown in FIG. 20 along an A1-A2-A3-A4 line in accordance with some other embodiments of the present disclosure.

FIG. 20 is a schematic top view of another exemplary array substrate in accordance with some other embodiments of the present disclosure. FIG. 21 illustrates a schematic cross-sectional view of the array substrate shown in FIG. 20 along an A1-A2-A3-A4 line.

As shown in FIGS. 20 and 21, the array substrate includes the plurality of first signal lines 11, the plurality of second signal lines 21, and the first conduction line 12. The plurality of first signal lines 11 are gate lines, and the plurality of second signal lines 21 are data lines. As shown in FIG. 20, the first conductive line 12 connects two or more of the gate lines with each other and connects two or more of the data lines with each other.

As shown in FIG. 21, the plurality of first signal lines 11 can be formed while the gate electrode 50 of the TFT is formed by a patterning process. The gate electrode 50 is connected to the plurality of first signal lines 11.

The first conductive line 12 can be formed while the pixel electrode 60 is formed by a patterning process. The first conductive line 12 can be connected to at least two first signal lines 11 through the third via holes c. The first conductive line 12 can be arranged to have an "L" shape that extends along directions that are perpendicular to each other, as shown in FIG. 20.

During the patterning process for forming the source 30 and the drain 40 of the TFT over the base substrate 10 over which the pixel electrode 60 is formed, the plurality of second signal lines 21 can also be formed to cross over the plurality of first signal lines 11. The first conductive line 12 connects at least two second signal lines 21.

Further, over the base substrate 10 over which the source 30 and the drain 40 of the TFT are formed, the passivation layer 132, i.e., the first insulating layer 13, the first via hole a, a fourth via hole d, and the transparent conductive layer 20 are formed. The fourth via hole d is formed in the passivation layer 132 at a position over the first conductive line 12 and between the two second signal lines 21 that are connected by the first conductive line 12. The first conductive line 12 can be disconnected during a process for forming the common electrode 201. The detailed processes are similar to those in the embodiments described above, and are not repeated here.

Figure 22:
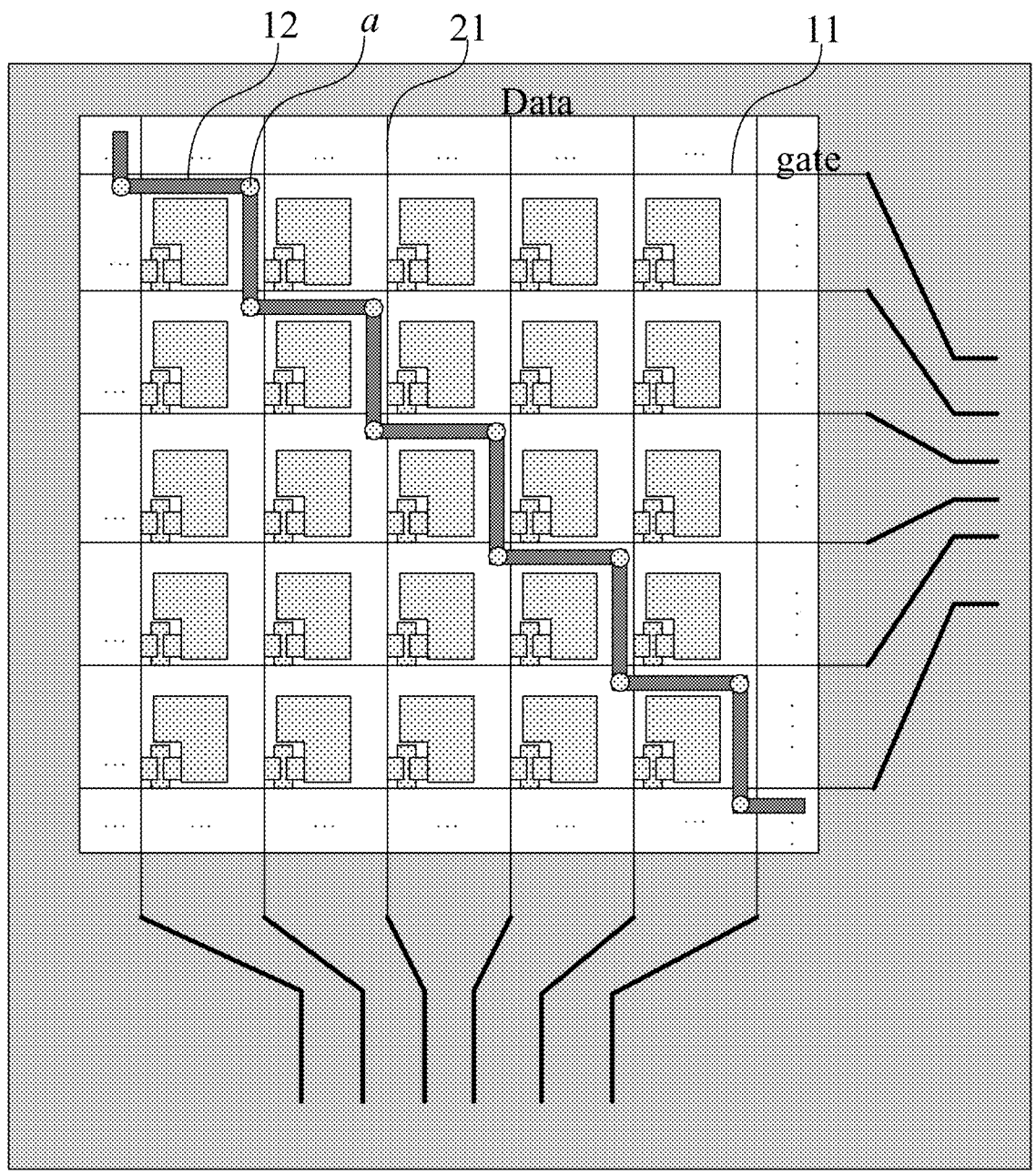
FIG. 22 illustrates a schematic top view of another exemplary array substrate in accordance with some other embodiments of the present disclosure.

In some embodiments, the first conductive line 12 can have a shape other than the L shape shown in FIG. 20. For example, FIG. 22 is a schematic top view of another exemplary array substrate in accordance with some other embodiments of the present disclosure. In the example shown in FIG. 22, the first conductive line 12 is arranged as a folded line.

Figure 23:
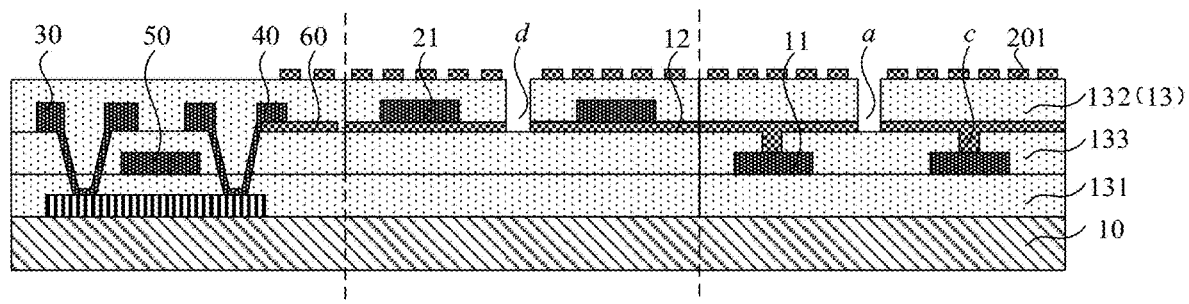
FIG. 23 illustrates a schematic cross-sectional view of the array substrate shown in FIG. 20 along the A1-A2-A3-A4 line in accordance with some other embodiments of the present disclosure.

The array substrate in the embodiments described above in connection with FIGS. 13-22 includes a bottom gate type TFT. In some other embodiments, the array substrate, such as the array substrate in FIG. 20, can include a top gate type TFT. FIG. 23 is a schematic cross-sectional view of the array substrate shown in FIG. 20 along the A1-A2-A3-A4 direction in the embodiments that the array substrate include the top gate type TFT.

Over the base substrate 10 over which an active layer and the gate insulating layer 131 are formed, the gate electrode 50 of the TFT and the plurality of first signal lines 11, i.e., gate lines, can be formed by a patterning process.

The insulating film layer 133 is formed over the base substrate 10 over which the gate electrode 50 of the TFT and the plurality of first signal lines 11 (gate lines) are formed. The third via hole c can be formed in the insulating film layer 133 by a patterning process.

In a same patterning process for forming the pixel electrode 60, the first conductive line 12 can be formed over the base substrate 10 over which the insulating film layer 133 is formed.

In a same patterning process for forming the source 30 and the drain 40 of the TFT, the plurality of second signal lines 21 (data lines) can be formed over the base substrate 10 over which the pixel electrode 60 is formed. The first conductive line 12 is connected to at least two second signal lines 21 (data lines).

The passivation layer 132, i.e., the first insulating layer 13, is formed over the base substrate 10 over which the second signal lines 21 (data lines) are formed. The first via hole a is formed in the passivation layer 132 at a position over the first conductive line and between two connected first signal lines 11 (gate lines). The fourth via hole d is formed in the passivation layer 132 at a position over the first conductive line 12 and between two connected second signal lines 21 (data lines). The transparent conductive layer 20 is formed over the base substrate 10 over which the passivation layer 132 is formed. The transparent conductive layer 20 can fill the first via hole a and the fourth via hole d, and connects to the first conductive line 12.

The transparent conductive layer 20 can be masked and exposed. During a process for forming a pattern of the common electrode 201, an etching solution capable of etching both a metal material and a transparent conductive material can be used to remove the transparent conductive material in the first via hole a and the fourth via hole d, and to disconnect the first conductive line 12. As such, the gate lines connected by the first conductive line 12 and the data lines connected by the first conductive line 12 can be disconnected to restore the functions of the gate lines and the data lines, respectively.

Figure 24:
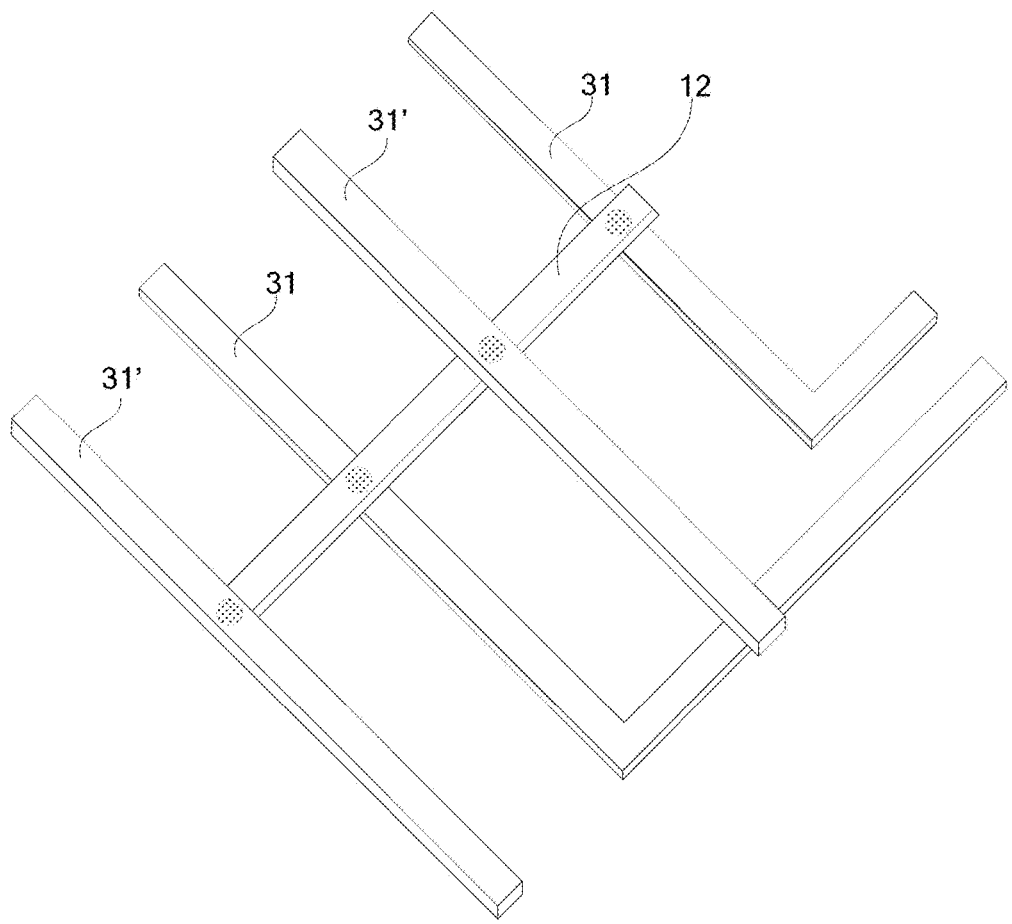
FIG. 24 illustrate a schematic structural diagram of a non-display region of an exemplary array substrate in accordance with some embodiments of the present disclosure.

FIG. 24 is a schematic structural diagram of a non-display region of an exemplary array substrate in accordance with some embodiments of the present disclosure.

In the non-display region Y, the plurality of leads 31 can be parallel to each other. The first conductive line 12 and the pixel electrode 60 can be formed of a same material and in a same layer. The first conductive line 12 can connect the plurality of leads 31 that are in a same layer as the gate lines, and can connect a plurality of leads 31' that are in a same layer as the data lines.

Figure 12:
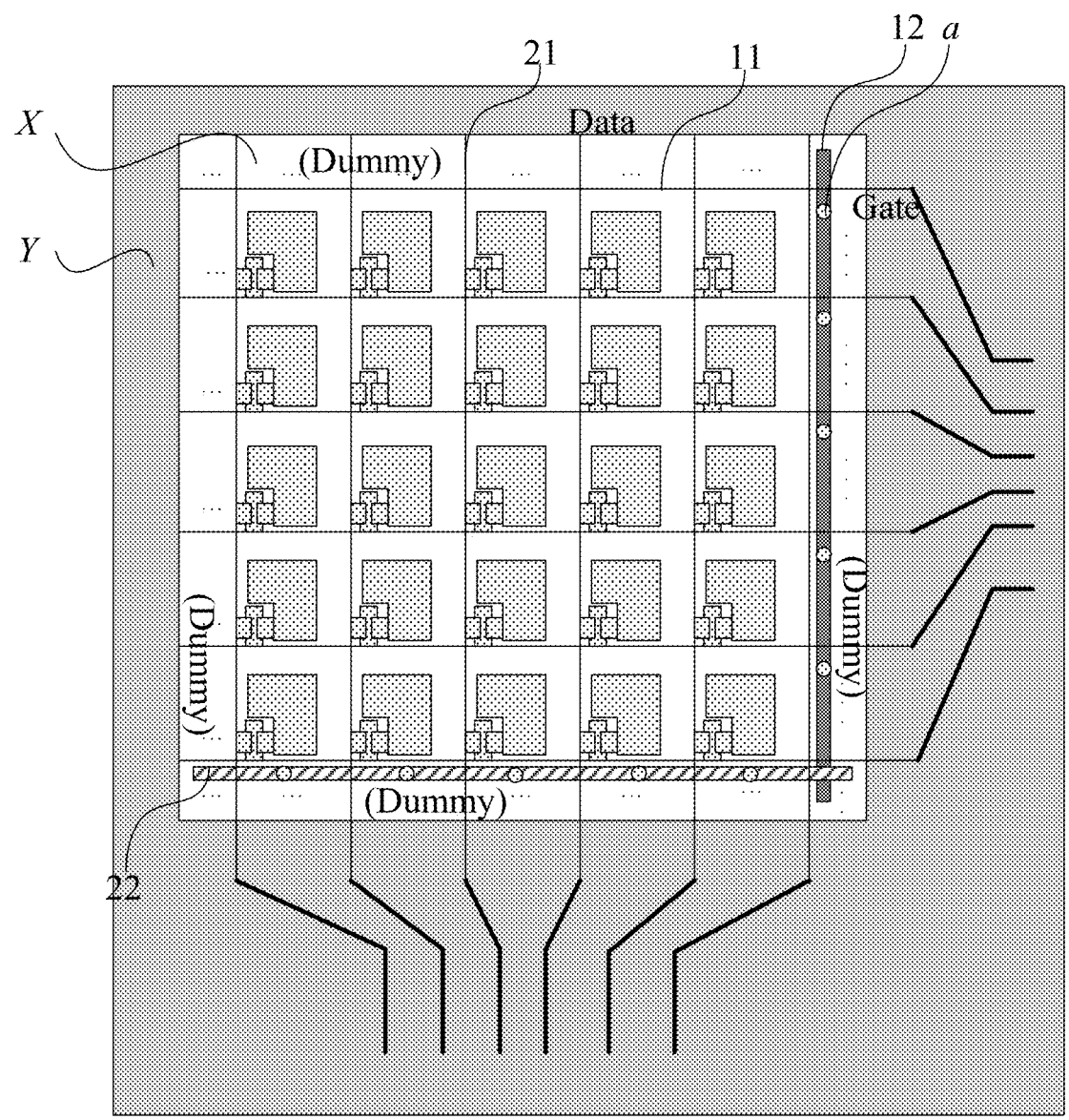
FIG. 12 illustrates a schematic top view of another exemplary array substrate in accordance with some other embodiments of the present disclosure.

FIG. 12 is a schematic top view of another exemplary array substrate in accordance with some other embodiments of the present disclosure. In some embodiments, in order to ensure the display effect of the display panel, one or more dummy regions may be provided at a peripheral area of the display region X of the display panel, as shown in FIG. 12. The one or more dummy regions may belong to the display region X. Usually, when signals are input to the display region X, the signals may be unstable after entering the display region X. The one or more dummy regions function as a buffer to stabilize the signals such that the signals can become stable when entering an effective display region of the display region X. Thus, the one or more dummy regions can ensure the stability of the display effect of the effective display region. Generally, the one or more dummy region are covered in a housing of the display panel and are not used for display.

In some embodiments, in order not to affect the display effect, the first conductive line 12, the second conductive line 22, or both, that are provided in the display region X can be arranged in the one or more dummy regions. A process of forming such an array substrate is similar to the process for forming the array substrate in one of the embodiments described above, and is not repeated here.

In addition, the process for fabricating the array substrate may include a number of masking processes, exposure processes, etching processes (e.g., removing process), and other processes. The first conductive line 12 and the second conductive line 22 usually have a small size and may have a poor contact or may be broken during the processes. Therefore, in some embodiments, a plurality of first conduction lines 12, or a plurality of second conductive lines 22, or both can be provided in one of the display region X and the non-display region Y or be provided in each of the display region X and the non-display region Y.

Another aspect of the present disclosure provides an array substrate formed by a method consistent with the disclosure, such as one of the above-described exemplary methods. The structure of the array substrate is described in detail above in connection with the fabricating process, and is not repeated here.

Another aspect of the present disclosure provides a display device including the above-described array substrate. The structure of the array substrate is described in detail above in connection with the fabricating process, and is not repeated here.

Accordingly, an array substrate, a fabricating method thereof, and a related display device are provided.

The provision of the examples described herein (as well as clauses phrased as "such as," "e.g.," "including," and the like) should not be interpreted as limiting the disclosure to the specific examples; rather, the examples are intended to illustrate only some of many possible aspects.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure. Features of the disclosed embodiments can be combined and rearranged in various ways. Without departing from the spirit and scope of the present disclosure, modifications, equivalents, or improvements to the present disclosure are conceivable to those skilled in the art and are intended to be encompassed within the scope of the present disclosure.

What is claimed is:

1. An array substrate, comprising:
a base substrate;
a plurality of signal lines over the base substrate;
a plurality of second signal lines over the base substrate;
an insulating layer between a layer comprising the plurality of signal lines and a layer comprising the plurality of second signal lines, wherein orthographic projections of the plurality of second signal lines on the base substrate intersect with orthographic projections of the plurality of signal lines on the base substrate;
a plurality of metal oxide portions arranged co-linearly and co-planarly, a respective one of the plurality of metal oxide portions is directly connected to one of two neighboring signal lines of the plurality of signal lines, the respective one of the plurality of metal oxide portions is insulated from another of the two neighboring signal lines, the two neighboring signal lines are insulated from each other, and the plurality of metal oxide portions comprise a metal oxide material; and
a plurality of second metal oxide portions arranged co-linearly and co-planarly, a respective one of the plurality of second metal oxide portions is directly connected to one of two neighboring second signal lines of the plurality of second signal lines, the respective one of the plurality of second metal oxide portions is insulated from another of the two neighboring second signal lines, the two neighboring second signal lines are insulated from each other, and the plurality of second metal oxide portions comprise a metal oxide material.

2. The array substrate of claim 1, further comprising a plurality of leads in a non-display region of the array substrate,
wherein at least two of the plurality of leads are respectively connected to two terminal metal oxide portions of the plurality of metal oxide portions.

3. A display apparatus, comprising:
the array substrate of claim 1, and one or more integrated circuits connected to the array substrate.

4. The array substrate of claim 1, wherein the plurality of metal oxide portions and the plurality of signal lines are in a same layer.

5. The array substrate of claim 1, further comprising an insulating layer between the plurality of metal oxide portions and a layer comprising the plurality of signal lines;
the respective one of the plurality of metal oxide portions extends through the insulating layer to connect to the one of the two neighboring signal lines of the plurality of signal lines.

6. The array substrate of claim 1, wherein the plurality of signal lines are a plurality of gate lines.

7. The array substrate of claim 1, wherein the plurality of signal lines are a plurality of data lines.

8. The array substrate of claim 1, wherein the one of the two neighboring signal lines of the plurality of signal lines is in a same layer as a plurality of gate lines, and the another of the two neighboring signal lines of the plurality of signal lines is in a same layer as a plurality of data lines.

9. The array substrate of claim 8, wherein an orthographic projection of the one of the two neighboring signal lines of the plurality of signal lines on the base substrate intersects with an orthographic projection of the another of the two neighboring signal lines of the plurality of signal lines.

10. The array substrate of claim 1, wherein the plurality of metal oxide portions is substantially transparent.

11. The array substrate of claim 1, wherein the plurality of metal oxide portions comprise indium tin oxide.

12. The array substrate of claim 1, wherein the plurality of metal oxide portions is in an inter-subpixel region between neighboring subpixels of the array substrate.

13. The array substrate of claim 12, wherein the plurality of metal oxide portions is a folded line having a plurality of turns through the inter-subpixel region.

14. The array substrate of claim 1, wherein the plurality of metal oxide portions is in a dummy region between a display area and a peripheral area of the array substrate.

15. The array substrate of claim 1, wherein the metal oxide material comprises indium tin oxide.

\* \* \* \* \*